(12) United States Patent
Hui et al.

(10) Patent No.: US 9,350,683 B2
(45) Date of Patent: May 24, 2016

(54) RELIABLE BULK DATA DISSEMINATION USING RATELESS CODES

(71) Applicant: Cisco Technology, Inc., San Jose, CA (US)

(72) Inventors: Jonathan W. Hui, Belmont, CA (US); Wei Hong, Berkeley, CA (US); Jean-Philippe Vasseur, Saint Martin d'Uriage (FR)

(73) Assignee: Cisco Technology, Inc., San Jose, CA (US)

( * ) Notice: Subject to any disclaimer, the term of this patent is extended or adjusted under 35 U.S.C. 154(b) by 289 days.

(21) Appl. No.: 13/920,802

(22) Filed: Jun. 18, 2013

(65) Prior Publication Data

US 2014/0372585 A1   Dec. 18, 2014

(51) Int. Cl.
*H04L 12/931* (2013.01)
*H03M 13/37* (2006.01)
*H04L 1/00* (2006.01)

(52) U.S. Cl.
CPC ........... *H04L 49/20* (2013.01); *H03M 13/3761* (2013.01); *H04L 1/004* (2013.01); *H04L 1/0076* (2013.01)

(58) Field of Classification Search
CPC ....... H04L 49/20; H04L 1/004; H04L 1/0076; H03M 13/3761
See application file for complete search history.

(56) References Cited

U.S. PATENT DOCUMENTS

| | | | |
|---|---|---|---|
| 7,924,761 B1 * | 4/2011 | Stevens | H03M 13/3761 370/315 |
| 8,156,209 B1 | 4/2012 | Phadnis et al. | |
| 8,484,212 B2 | 7/2013 | Liu et al. | |
| 2005/0251721 A1 * | 11/2005 | Ramesh et al. | 714/748 |
| 2008/0181163 A1 * | 7/2008 | Ye et al. | 370/312 |
| 2009/0252227 A1 * | 10/2009 | NepomucenoLeung et al. | 375/240.13 |
| 2010/0046409 A1 * | 2/2010 | Lohmar et al. | 370/312 |
| 2010/0265970 A1 * | 10/2010 | Toscano | 370/522 |
| 2011/0041041 A1 * | 2/2011 | Kim | 714/780 |
| 2011/0179455 A1 * | 7/2011 | Thompson | 725/82 |
| 2011/0235524 A1 | 9/2011 | North et al. | |
| 2012/0105214 A1 | 5/2012 | Sanders | |
| 2012/0197852 A1 | 8/2012 | Dutta et al. | |
| 2012/0197856 A1 | 8/2012 | Banka et al. | |
| 2012/0197898 A1 | 8/2012 | Pandey et al. | |
| 2012/0303618 A1 | 11/2012 | Dutta et al. | |
| 2012/0320923 A1 | 12/2012 | Vasseur et al. | |
| 2013/0201909 A1 * | 8/2013 | Bosch et al. | 370/328 |
| 2013/0297609 A1 | 11/2013 | Liu et al. | |
| 2013/0308700 A1 * | 11/2013 | Koike-Akino et al. | 375/240.07 |

OTHER PUBLICATIONS

Winter, et al., "RPL: IPv6 Routing Protocol for Low-Power and Lossy Networks", Request for Comments 6550, Mar. 2012, 157 pages, Internet Engineering Task Force Trust.

* cited by examiner

*Primary Examiner* — Brian J Gillis
*Assistant Examiner* — Gil H. Lee
(74) *Attorney, Agent, or Firm* — Parker Ibrahim & Berg LLC; James M. Behmke; Stephen D. LeBarron

(57) ABSTRACT

In one embodiment, an aggregating node receives feedback messages from one or more destination nodes in the network. The destination nodes are designated to receive data as packets from a source node using rateless coding. Further, the feedback messages indicate whether packets are needed at a corresponding destination node to complete the data. Then, the feedback messages are aggregated into a single aggregated message, and the aggregated message is transmitted toward the source node.

21 Claims, 10 Drawing Sheets

RELIABLE BULK DATA DISSEMINATION USING RATELESS CODES

TECHNICAL FIELD

The present disclosure relates generally to computer networks, and, more particularly, to bulk data dissemination using rateless codes.

BACKGROUND

Low-power and lossy networks (LLNs), e.g., sensor networks, have a myriad of applications, such as Smart Grid and Smart Cities. A typical Smart Grid LLN, for example, involves hundreds or thousands of devices that may span tens of hops. Due to the density of these networks, the need to perform large-scale point-to-multipoint data delivery, e.g., bulk data dissemination, frequently arises. For example, tasks such as large-scale configuration updates of network devices or application endpoints, large-scale command delivery, and broadcast-based services over a mesh network, necessitate disseminating large amounts of data from a backend device, e.g., a network management system (NMS) or a system control center, to destination devices which may reside deep in the network tree. As such, these oft-used bulk data delivery methods require both is reliability and efficiency, though various challenges are presented with such bulk data dissemination in LLNs.

BRIEF DESCRIPTION OF THE DRAWINGS

The objects, features, aspects, and advantages of the embodiments disclosed herein will become apparent from the following detailed description when taken in conjunction with the following accompanying drawings.

Figure 1:
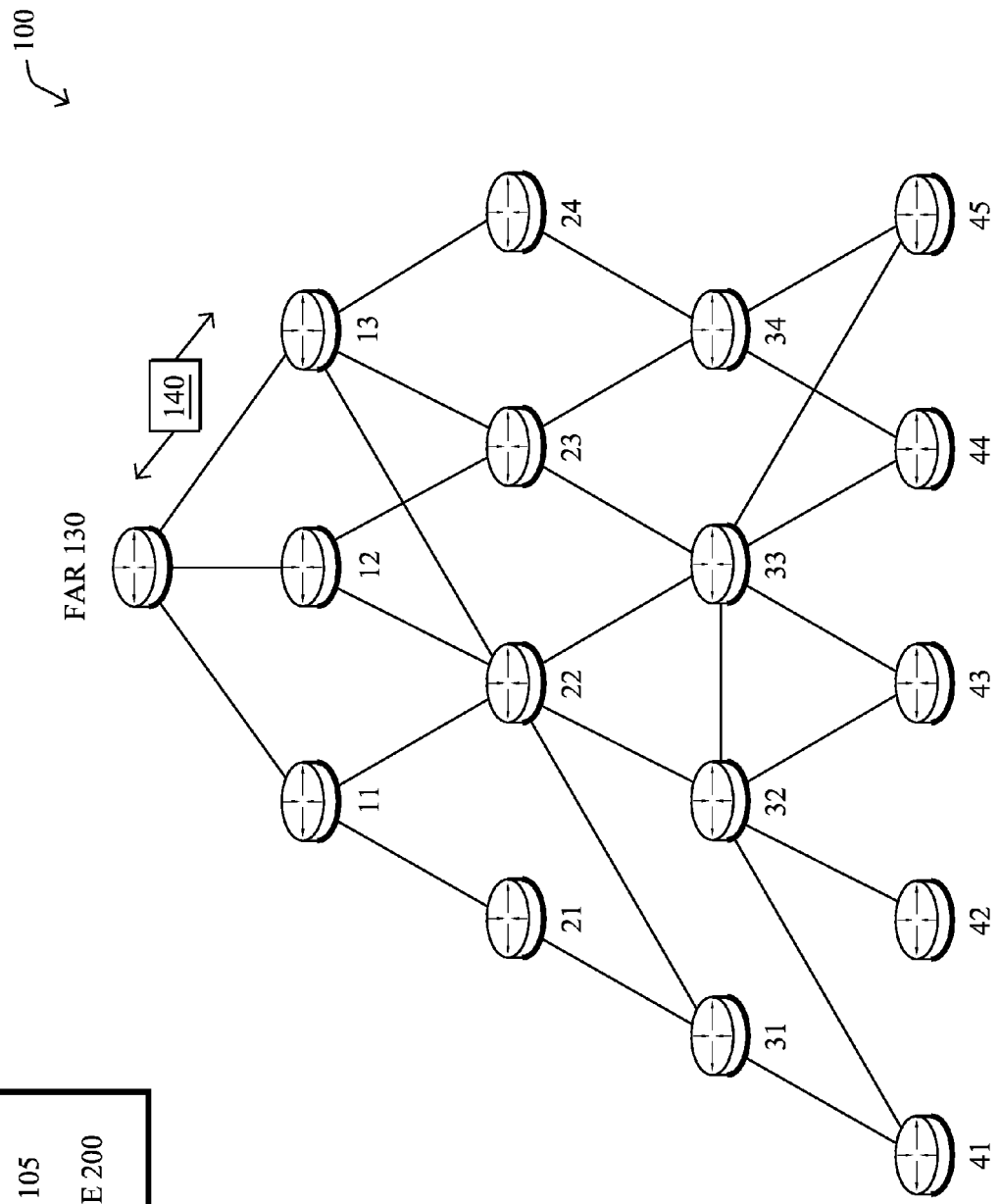
FIG. 1 illustrates an example communication network.

It should be understood that the above-referenced drawings are not necessarily to scale, presenting a somewhat simplified representation of various preferred features is illustrative of the basic principles of the disclosure. The specific design features of the present disclosure, including, for example, specific dimensions, orientations, locations, and shapes, will be determined in part by the particular intended application and use environment.

DESCRIPTION OF EXAMPLE EMBODIMENTS

Overview

According to the disclosed embodiments, feedback is aggregated for reliable bulk data dissemination using rateless codes. The embodiments illustratively include receiving, at an aggregating node in a network, feedback messages from one or more destination nodes in the network. The destination nodes are designated to receive data as packets from a source node using rateless coding. Further, the feedback messages indicate whether packets are needed at a corresponding destination node to complete the data. Then, the feedback messages are aggregated into a single aggregated message, and the aggregated message is transmitted toward the source node.

Description

A computer network is a geographically distributed collection of nodes interconnected by communication links and segments for transporting data between end nodes, such as personal computers and workstations, or other devices, such as sensors, etc. Many types of networks are available, ranging from local area networks (LANs) to wide area networks (WANs). LANs typically connect the nodes over dedicated private communication links located in the same general physical location, such as a building or campus. WANs, on the other hand, typically connect geographically dispersed nodes over long-distance communication links, such as common carrier telephone lines, optical lightpaths, synchronous optical networks (SONET), synchronous digital hierarchy (SDH) links, or power-line communications (PLC) such as IEEE 61334, IEEE P1901.2, and others. In addition, a Mobile Ad-Hoc Network (MANET) is a kind of wireless ad-hoc network, which is generally considered a self-configuring network of mobile routers (and associated hosts) connected by wireless links, the union of which forms an arbitrary topology.

Smart object networks, such as sensor networks, in particular, are a specific type of network having spatially distributed autonomous devices such as sensors, actuators, etc., that cooperatively monitor physical or environmental conditions at different locations, such as, e.g., energy/power consumption, resource consumption (e.g., water/gas/etc. for advanced metering infrastructure or "AMI" applications) temperature, pressure, vibration, sound, radiation, motion, pollutants, etc. Other types of smart objects include actuators, e.g., responsible for turning on/off an engine or perform any other actions. Sensor networks, a type of smart object network, are typically shared-media networks, such as wireless or PLC networks. That is, in addition to one or more sensors, each sensor device (node) in a sensor network may generally be equipped with a radio transceiver or other communication port such as PLC, a microcontroller, and an energy source, such as a battery. Often, smart object networks are considered field area networks (FANs), neighborhood area networks (NANs), etc. Generally, size and cost constraints on smart object nodes (e.g., sensors) result in corresponding constraints on resources such as energy, memory, computational speed and bandwidth.

FIG. 1 is a schematic block diagram of an example computer network 100. Illustratively, computer network 100 comprises devices 200 (e.g., labeled as "FAR," "11," "12," . . . "45"), as described in FIG. 2 below, interconnected by communication links 105. For instance, the links 105 may be wired links or shared media (e.g., wireless links, PLC links, etc.) where certain devices 200, such as routers, sensors, computers, actuators, and the like, may be in communication with other nodes 200, based on distance, signal strength, current operational status, location, and the like. A field area router (FAR) 130, which may serve as a "root" node in the illustrated computer network, may be in communication with the network 100. The "root" node may be of any suitable type for centralized network management, such as operating as, or in conjunction with, a network management system (NMS).

For the purposes of the present disclosure, the is computer network 100 may be of any suitable type of network, including, but limited to, an LLN. Further, the devices 200 may be referred to as "devices" or "nodes" interchangeably.

Those skilled in the art will understand that any number of nodes, devices, links, etc. may be used in a computer network, and that the view shown herein is for simplicity. Also, those skilled in the art will further understand that while the network is shown in a certain orientation, particularly with a "root" node (FAR), the network 100 is merely an example illustration that is not meant to limit the disclosure.

Data packets 140 (e.g., traffic and/or messages sent between the devices/nodes) may be exchanged among the devices 200 of the computer network 100 using predefined network communication protocols such as certain known wired protocols, wireless protocols (e.g., IEEE Std. 802.15.4, WiFi, Bluetooth®, etc.), LLN protocols, or other shared-media protocols where appropriate (e.g., PLC). In this context, a protocol consists of a set of rules defining how the nodes interact with each other.

Figure 2:
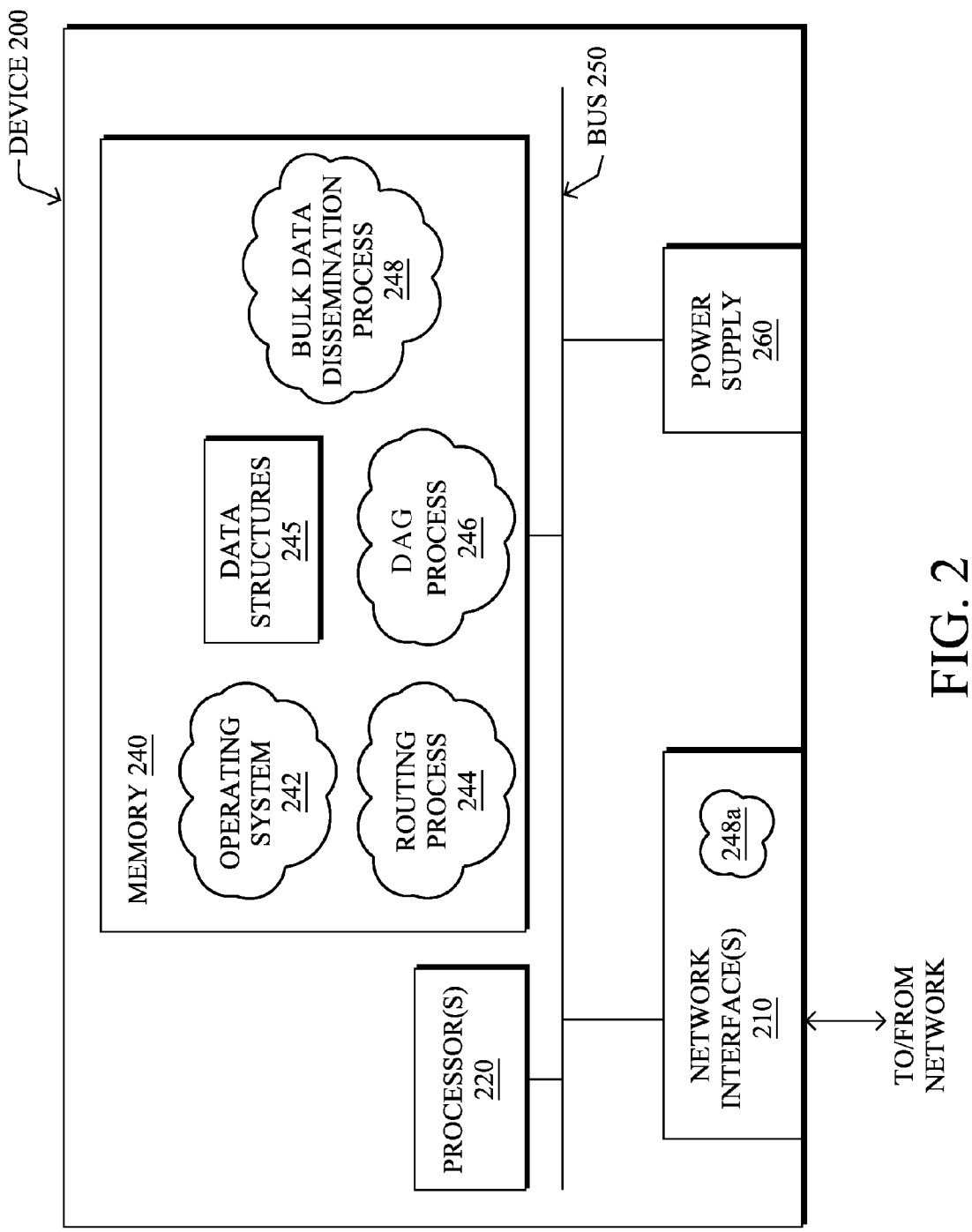
FIG. 2 illustrates an example network device/node.

FIG. 2 is a schematic block diagram of an example node/device 200 that may be used with one or more embodiments described herein, e.g., as shown in FIG. 1. The device may comprise one or more network interfaces 210 (e.g., wireless/channel-hopping), at least one processor 220, and a memory 240 interconnected by a system bus 250, as well as a power supply 260 (e.g., plug-in, battery, etc.), all of which may be interconnected by a system bus 250.

The network interface(s) 210, e.g., transceivers, contain the mechanical, electrical, and signaling circuitry for communicating data over wireless links 105 coupled to the network 100. The network interfaces may be configured to transmit and/or receive data using a variety of different communication protocols as noted above and as will be understood by those skilled in the art. The device 200 may have multiple different types of network interfaces 210, e.g., wireless and wired/physical connections, and that the view herein is merely for illustration. Also, while the network interface 210 is shown separately from power supply 260, in the case of PLC, for example, the network interface 210 may communicate through the power supply 260, or may be an integral component of the power supply. In some specific configurations the PLC signal may be coupled to the power line feeding into the power supply.

The memory 240 comprises a plurality of storage locations that are addressable by the processor(s) 220 and the network interface(s) 210 for storing software programs and data structures associated with the embodiments described herein. Note that certain devices may have limited memory or no memory (e.g., no memory for storage other than for programs/processes operating on the device). The processor(s) 220 may comprise necessary elements or logic adapted to execute the software programs and manipulate the data structures 245. An operating system 242, portions of which are typically resident in memory 240 and executed by the processor, functionally organizes the device by, inter alia, invoking operations in support of software processes and/or services executing on the device. These software processes and/or services may comprise routing process/services 244, a directed acyclic graph (DAG) process 246, and an illustrative "bulk data dissemination" process 248, as described herein. Note that while the bulk data dissemination 248 is shown in centralized memory 240, alternative embodiments provide for the process, or portions thereof, to be specifically operated within the network interfaces 210, such as a component of a MAC layer (process "248a").

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes.

Routing process (services) 244 contains computer executable instructions executed by the processor(s) 220 to perform functions provided by one or more routing protocols, such as proactive or reactive routing protocols as will be understood by those skilled in the art. These functions may, on capable devices, be configured to manage a is routing/forwarding table (e.g., a data structure 245) containing, e.g., data used to make routing/forwarding decisions. In particular, in proactive routing, connectivity is discovered and known prior to computing routes to any destination in the network, e.g., link state routing such as Open Shortest Path First (OSPF), or Intermediate-System-to-Intermediate-System (ISIS), or Optimized Link State Routing (OLSR).

Reactive routing, on the other hand, discovers neighbors (i.e., does not have an a priori knowledge of network topology), and in response to a needed route to a destination, sends a route request into the network to determine which neighboring node may be used to reach the desired destination. Example reactive routing protocols may comprise Ad-hoc On-demand Distance Vector (AODV), Dynamic Source Routing (DSR), DYnamic MANET On-demand Routing (DYMO), etc. Notably, on devices not capable or configured to store routing entries, routing process 244 may consist solely of providing mechanisms necessary for source routing techniques. That is, for source routing, other devices in the network can tell the less capable devices exactly where to send the packets, and the less capable devices simply forward the packets as directed.

Notably, mesh networks have become increasingly popular and practical in recent years. In particular, shared-media mesh networks, such as wireless or PLC networks, etc., are often on what is referred to as low-power and lossy networks (LLNs). LLNs, e.g., certain sensor networks, may be used in a myriad of applications such as for "Smart Grid" and "Smart Cities." LLNs are comprised of anything from a few dozen and up to thousands or even millions of LLN routers, and support point-to-point traffic (e.g., between devices inside the LLN), point-to-multipoint traffic (e.g., from a central control point, such as the root node, to a subset of devices inside the LLN) and multipoint-to-point traffic (e.g., from devices inside the LLN towards a central control point).

An example implementation of LLNs is an "Internet of Things" network. Loosely, the term "Internet of Things" or "IoT" may be used by those in the art to refer to uniquely identifiable objects (things) and their virtual representations in a network-based architecture. In particular, the next frontier in the evolution of the Internet is the ability to connect more than just computers and communications devices, but rather the ability to is connect "objects" in general, such as lights, appliances, vehicles, HVAC (heating, ventilating, and air-conditioning), windows and window shades and blinds, doors, locks, etc. The "Internet of Things" thus generally refers to the interconnection of objects (e.g., smart objects), such as sensors and actuators, over a computer network (e.g., IP), which may be the Public Internet or a private network.

Such devices have been used in the industry for decades, usually in the form of non-IP or proprietary protocols that are connected to IP networks by way of protocol translation gateways. With the emergence of a myriad of applications, such as the smart grid, smart cities, and building and industrial automation, and cars (e.g., that can interconnect millions of objects for sensing things like power quality, tire pressure, and temperature and that can actuate engines and lights), it has been of the utmost importance to extend the IP protocol suite for these networks.

An example protocol specified in an Internet Engineering Task Force (IETF) Proposed Standard, Request for Comment (RFC) 6550, entitled "RPL: IPv6 Routing Protocol for Low Power and Lossy Networks" by Winter, et al. (March 2012), provides a mechanism that supports multipoint-to-point (MP2P) traffic from devices inside the LLN towards a central control point (e.g., LLN Border Routers (LBRs) or "root nodes/devices" generally), as well as point-to-multipoint (P2MP) traffic from the central control point to the devices inside the LLN (and also point-to-point, or "P2P" traffic). RPL (pronounced "ripple") may generally be described as a distance vector routing protocol that builds a Directed Acyclic Graph (DAG) for use in routing traffic/packets 140, in addition to defining a set of features to bound the control traffic, support repair, etc. Notably, as may be appreciated by those skilled in the art, RPL also supports the concept of Multi-Topology-Routing (MTR), whereby multiple DAGs can be built to carry traffic according to individual requirements.

Also, a directed acyclic graph (DAG) is a directed graph having the property that all edges are oriented in such a way that no cycles (loops) are supposed to exist. All edges are contained in paths oriented toward and terminating at one or more root nodes (e.g., "clusterheads or "sinks"), often to interconnect the devices of the DAG with a larger infrastructure, such as the Internet, a wide area network, or other domain. In addition, a Destination Oriented DAG (DODAG) is a DAG rooted at a single destination, i.e., at a single DAG root with no outgoing edges. A "parent" of a particular node within a DAG is an immediate successor of the particular node on a path towards the DAG root, such that the parent has a lower "rank" than the particular node itself, where the rank of a node identifies the node's position with respect to a DAG root (e.g., the farther away a node is from a root, the higher is the rank of that node). Note also that a tree is a kind of DAG, where each device/node in the DAG generally has one parent or one preferred parent. DAGs may generally be built (e.g., by DAG process 246 and/or routing process 244) based on an Objective Function (OF). The role of the Objective Function is generally to specify rules on how to build the DAG (e.g. number of parents, backup parents, etc.).

Figure 3:
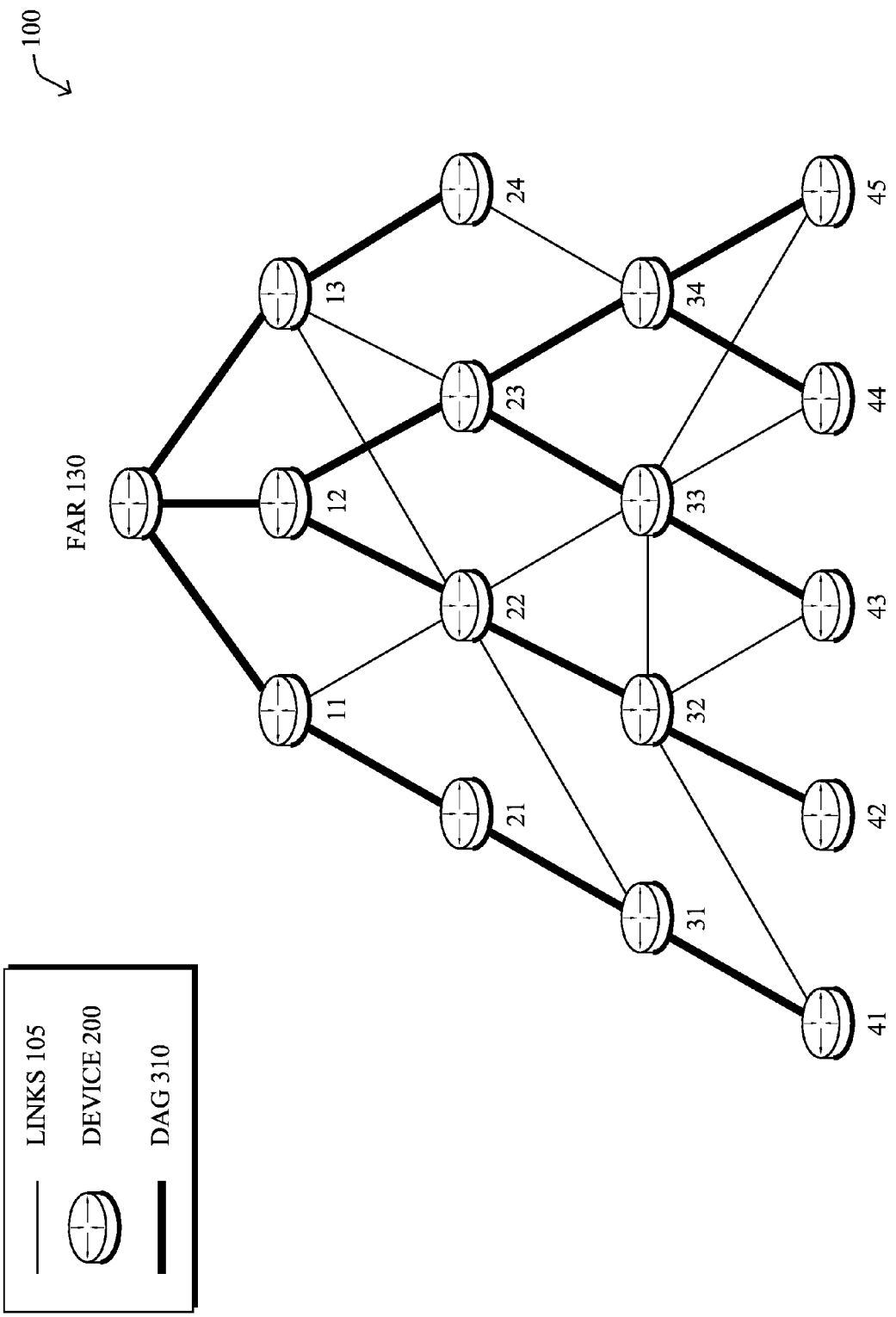
FIG. 3 illustrates an example simplified directed acyclic graph (DAG) in the communication network.

FIG. 3 illustrates an example simplified DAG that may be created in accordance with the properties described above within network 100 of FIG. 1. For instance, certain links 105 may be selected for each node to communicate with a particular parent (and thus, in the reverse, to communicate with a child, if one exists). These selected links form the DAG 310 (shown as bolded lines), which extends from the root node 130 toward one or more leaf nodes (nodes without children). Traffic/packets 140 (shown in FIG. 1) may then traverse the DAG 310 in either the upward direction toward the root or downward toward the leaf nodes, particularly as described herein.

As noted above, due to the density of LLNs, the need to perform large-scale point-to-multipoint data delivery, e.g., bulk data dissemination, frequently arises. For instance, tasks such as large-scale configuration updates of network devices or application endpoints, large-scale command delivery, and broadcast-based services over a mesh network, necessitate disseminating large amounts of data from a backend device, e.g., NMS or FAR, to destination devices which may reside deep in the network tree. For example, a firmware update may require the transfer of a binary firmware image from the NMS to one or many devices (e.g., millions), and a typical LLN device may have a firmware image size on the order of 100 kilobytes to megabytes. As such, these oft-used bulk data delivery methods require both reliability and efficiency.

Figure 4:
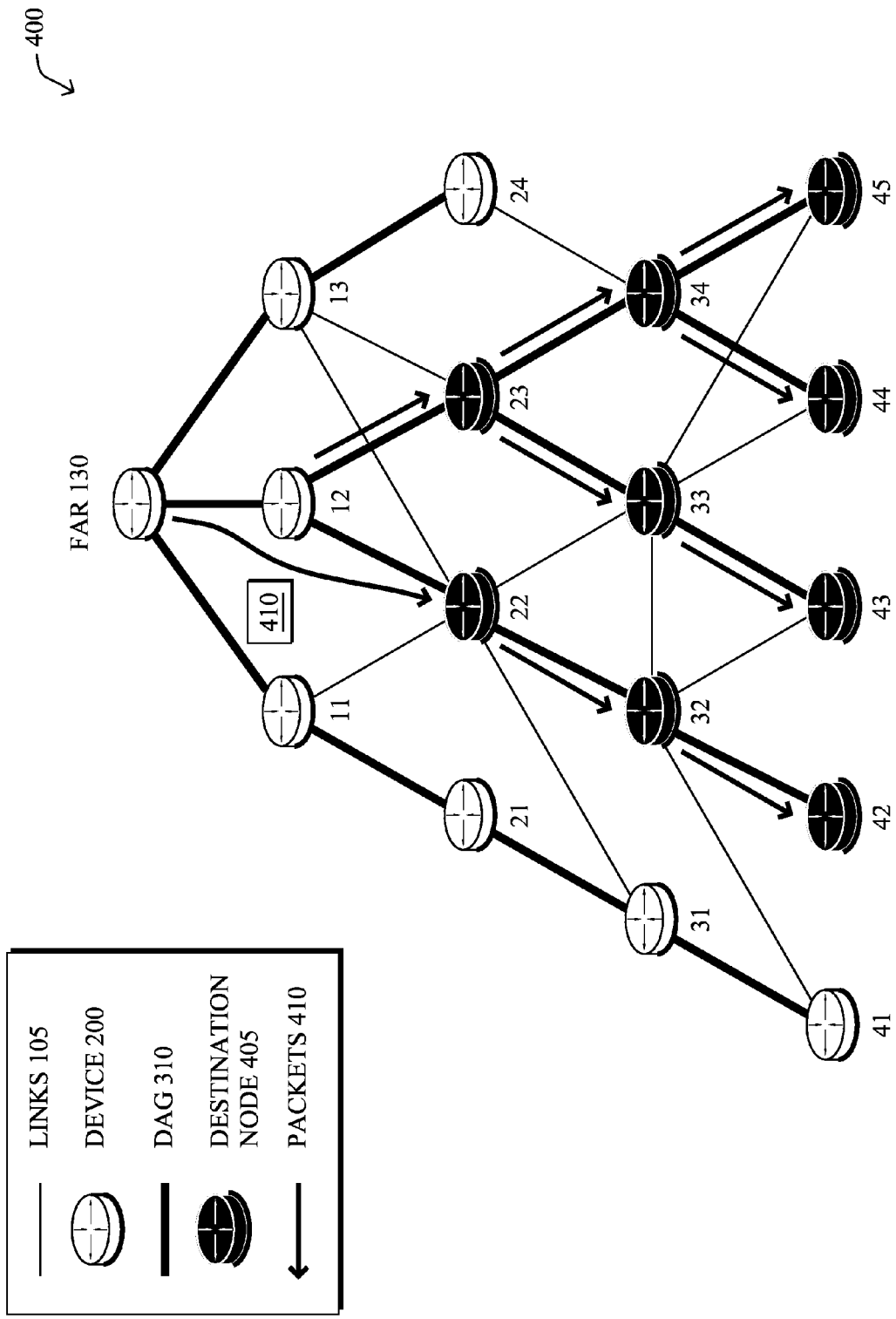
FIG. 4 illustrates an example of bulk data dissemination from a source node to one or more destination nodes.

Making bulk data dissemination reliable involves delivering a relatively large is amount of data from a source to one or more destinations and collecting feedback from each destination at the source. In this regard, an example of bulk data dissemination from a source node to one or more destination nodes is illustrated in FIG. 4. As shown in FIG. 4, network 400 comprises nodes 200 interconnected via communications links 105, whereby selected links form the DAG 310 (shown as bolded lines), which extends from the root node 130 toward one or more leaf nodes. Nodes "22", "23", "32" ... "45" are identified as destination nodes 405 ("destination nodes" and "receivers" may be used interchangeably), which are each designated to receive data from the source node, e.g., FAR 130. Data packets 410 are transmitted from the FAR 130 along the links 105 to the destination nodes 405 (any suitable path to deliver data packets from the source to the destinations may be utilized). It should be understood that the data dissemination source may be a central server that serves the entire Field Area Network (FAN), such as an NMS; or, the data dissemination source may be delegated to intermediate devices, such as a FAR or other designated nodes in the LLN.

Using a conventional configuration update protocol, whereby particular nodes, i.e., destination nodes 405, receive configuration updates from a source node, i.e., FAR 130, the network devices operate as follows:

1) The source node 130 divides a configuration file into packets 410 and marks each packet with an index.

2) The destination nodes 405 request the configuration file using a bit-vector that explicitly indicates what packets 410 have not yet been received.

3) The source node 130 receives the packet requests and transmits the packets through the DAG 310 for the destination nodes 405 which requested them. If fewer than N destination nodes 405 in the same personal area network (PAN), e.g., network 400, request the same packet, the source node 130 may use unicast to deliver the packet(s) 410 to each node; however, if N or more destination nodes 405 in the same PAN request the same packet(s) 410, the source node 130 may use multicast to deliver the packet.

4) Steps 2 and 3 are repeated until the destination nodes 405 no longer request any is additional packets 410, i.e., no further feedback is transmitted. This, of course, means that all packets which make up the configuration file have been received.

Although the above protocol may provide a workable solution in some networks, it suffers from a number of drawbacks when implemented in LLNs, in particular. For example, receivers, e.g., destination nodes, must periodically request packets they have not received. As a result, the number of requests that a source, e.g., NMS, receives is dependent on the number of active receivers, which may number in the thousands for LLNs. This creates congestion at the NMS, as well as the FAR for each PAN. Further, receivers must request each packet individually. As a result, each receiver must encode a unique node identifier for each requested packet, which consumes a nontrivial amount of space in both memory and payload size for the request message. Even further, a typical Smart Grid LLN involves hundreds or thousands of devices that may span tens of hops. Nodes in very dense areas and/or deep in the network will have less reliability in having their respective request messages successfully delivered to the source, due to lossy links, low bandwidth, low memory and/or processing capability, etc. Accordingly, existing bulk data dissemination methodologies do not scale well, and thus are unreliable, with increasing network sizes containing "constrained" devices, as in the case of LLNs.

Notably, rateless codes may be utilized to mitigate some of the problems referenced above. In coding theory, a rateless code (or fountain code), is a type of erasure code which does not exhibit a fixed code rate. Importantly, rateless codes have the property that a potentially limitless sequence of symbols can be generated from a given set of original source symbols, such that the original source symbols can be recovered from any subset of the encoding sequence equal to or slightly larger than the number of original source symbols. In other words, a receiver may recover the original source data, e.g., decode a message, after receiving any K symbols of the encoding stream, whereby K represents the number of original source symbols. Therefore, a sender may keep generating new randomly coded packets without having to retransmit any previous packet; then, once the receiver has received at least K randomly coded packets, the receiver can fully recover/decode all of the data.

Using existing bulk data delivery methodologies, as described above, a destination node must explicitly request specific data packets which the destination node has yet to receive. However, using rateless codes, a destination node need only indicate that it needs additional data. Since the receiver can recover the original data, such as a configuration file, command instructions, etc., with any subset of the encoding stream, the receiver can utilize any new data packet that it receives from the source. As such, rateless codes ultimately reduce the amount of information required in feedback messages sent to the source.

Even with rateless codes though, a reliable bulk data transfer still requires feedback from receivers, such that a source node may know when to start/stop sending packets (note that the present disclosure relates to reliably delivering a finite data set to multiple devices, rather than delivering a continuous real-time stream of data). Although rateless codes may reduce the size of feedback messages, a problem still exists with the large amount of feedback transmissions, and thus, the network traffic caused by feedback transmissions. This is particularly a problem in an LLN, where thousands of nodes may exist, and dropped packets are a common problem due to network constraints.

Reliable Bulk Data Dissemination Using Rateless Codes

The techniques herein allow for reliable bulk data dissemination using rateless codes in LLNs. In particular, the aggregation methods described herein are used to reduce the number of request messages delivered to the source. Because rateless codes allow devices to decode a message after receiving any K packets, request messages may be aggregated by calculating the maximum value of packets needed. A request message may list a limited number of receivers and requested packets to allow for unicast transmission from the source when forwarding requests for a small number of receivers; but the message may be aggregated to a single integer that represents the maximum requested packets when forwarding requests for many receivers. Also, a device may identify itself as a sub-DAG root if the request is received from many children. A time indicator may be included in request messages to account for messages generated by the is source while forwarding/aggregating the request message. A 1-hop broadcast, multicast, and/or promiscuous mode may be used to further suppress request messages from children when forwarding. Finally, different randomly coded messages may be sent to each PAN to allow efficient operation even when devices migrate between different PANs.

Specifically, according to the disclosed embodiments, an aggregating node receives feedback messages from one or more destination nodes in the network. The destination nodes are designated to receive data as packets from a source node using rateless coding. Further, the feedback messages indicate whether packets are needed at a corresponding destination node to complete the data. Then, the feedback messages are aggregated into a single aggregated message, and the aggregated message is transmitted toward the source node.

Illustratively, the techniques described herein may be performed by hardware, software, and/or firmware, such as in accordance with the bulk data dissemination process 248, which may contain computer executable instructions executed by the processor(s) 220 (or an independent processor of network interface(s) 210) to perform functions relating to the techniques described herein. Generally, the techniques described herein may be processed by similar components that are understood in the art to be operable to perform bulk data dissemination.

Operationally, the techniques herein generally relate to, but are not limited to, reliable bulk data dissemination using rateless codes, and in particular, efficiently aggregating feedback from the destination nodes. For example, according to the disclosed embodiments, an aggregating node/sub-DAG root node need only forward a single request packet, i.e., feedback message, indicating that one or more destination nodes in its sub-DAG are requesting data. This is because when using rateless codes, a packet request need only indicate that more data is needed, and optionally how much data, in order to recover the original source data. Therefore, the aggregating node is able to efficiently aggregate the request packets sent by the destination nodes in its sub-DAG.

Figure 5:
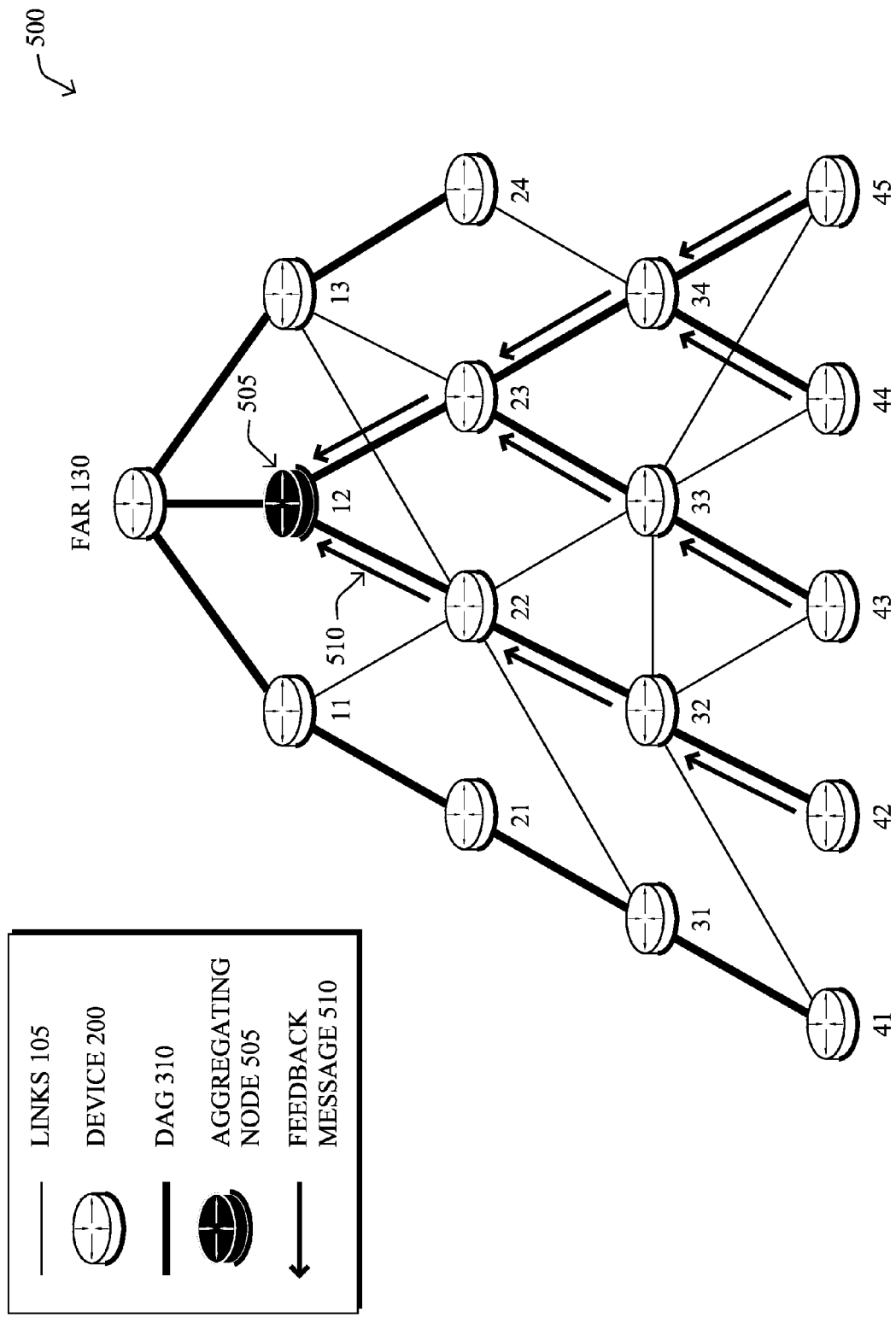
FIG. 5 illustrates an example of feedback messages received at an aggregating node.

FIG. 5 illustrates an example of feedback messages received at an aggregating node. As shown in FIG. 5, the network 500 comprises nodes 200 interconnected via communications links 105, whereby selected links form the DAG 310 (shown as bolded lines), which extends from the root node 130 toward one or more leaf nodes. The network 500 is arranged in the same manner as shown in FIG. 3.

Node "12" represents an aggregating node 505, e.g., a sub-DAG node, at which one or more feedback messages 510 are received. Although a single aggregating node 505 is depicted in FIG. 5, several aggregating nodes may exist throughout a network tree, and aggregating nodes may aggregate data from other aggregating nodes, e.g., hierarchical aggregation). The same principles described herein may apply regardless of the amount of aggregating nodes. As shown in FIG. 4, nodes "22", "23", "32" . . . "45" are designated as the destination nodes 405, which are to receive data from the source node, e.g., FAR 130. After receiving the data packets 410 transmitted from the FAR 130, the destination nodes 405 may transmit feedback messages 510 toward the source node. As referenced above, in order for bulk data dissemination to be reliable, a device receiving data, i.e., a destination node, may provide feedback if any part of the data has not yet been received. In other words, the feedback may indicate whether packets are needed at a particular destination node. This way, the source node understands that additional data packets must be transmitted for the destination nodes to recover the original message.

The feedback messages 510 are transmitted along the communications links 105 toward the source node, e.g., FAR 130. Along the way, the feedback messages 510 from the destination nodes 405 may be received by an aggregating node 505, or a "sub-DAG node." For the purposes of receiving, and later aggregating, one or more feedback messages 510, the aggregating node 505 may be viewed as a source node of a sub-portion of the DAG, e.g., the "descendent" nodes of the aggregating node (child nodes, grandchild nodes, etc.).

Figure 6:
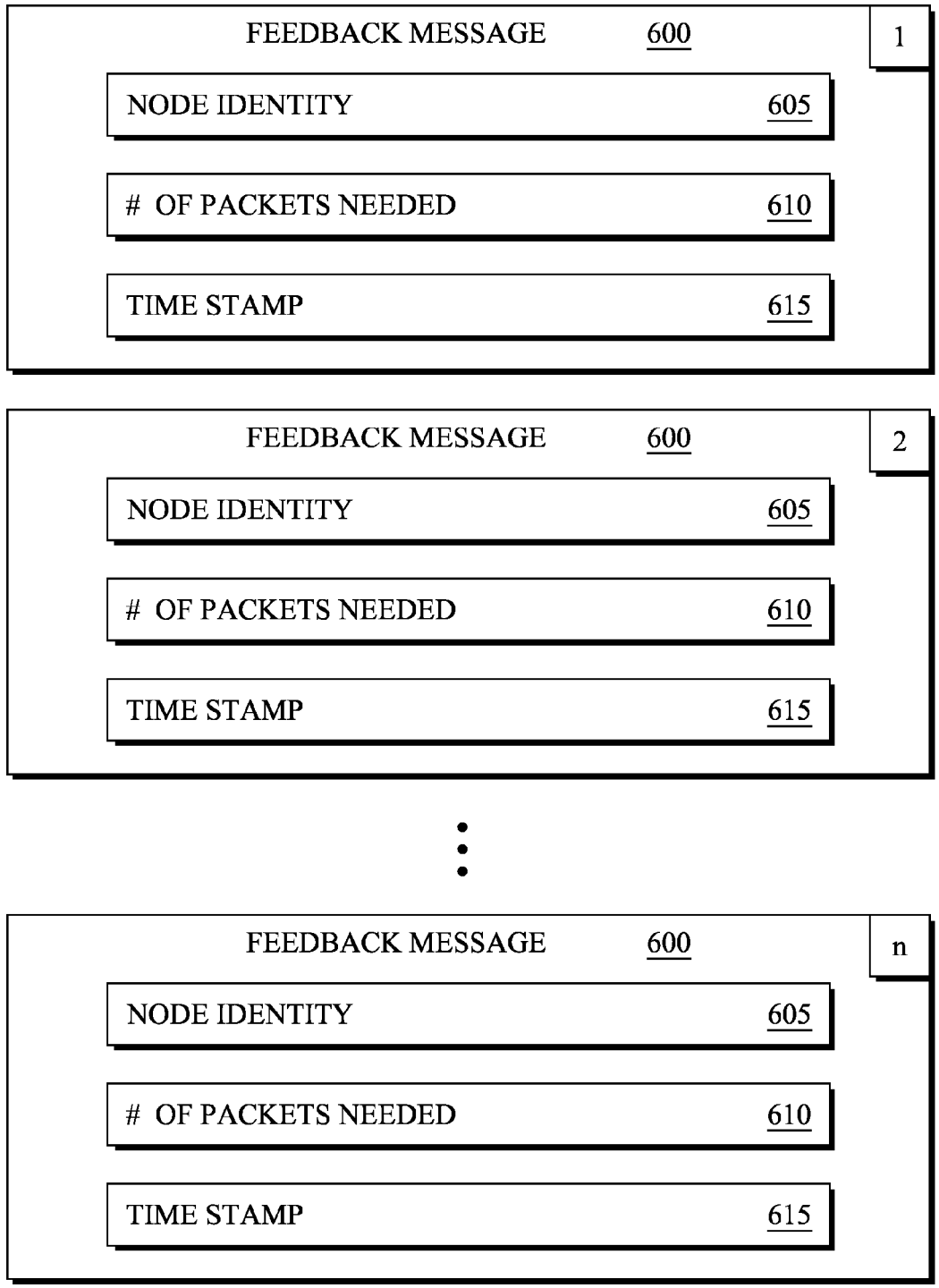
FIG. 6 illustrates example feedback messages transmitted by destination nodes.

FIG. 6 illustrates example feedback messages transmitted by destination nodes. As shown in FIG. 6, one or more feedback messages 600 each contain a number of various data fields. The feedback messages 600 may be treated as equivalent to the feedback messages 510, as shown in FIG. 5. It should be understood that the feedback messages may be configured in any manner suitable to designate whether additional packets are needed by a particular destination node. Thus, the feedback messages 600 are depicted in FIG. 6 only for illustration purposes and should not be treated as limiting.

Because rateless codes allow a destination node 405 to successfully decode data being disseminated from a source node after receiving any K packets, whereby the original data comprises K packets, the destination node no longer needs to keep track of specifically which packets it has or has not received. This is due to inherent properties of rateless codes, which allow a destination node to only indicate whether additional packets are necessary, and optionally, how many packets are necessary, to successfully decode the original data. For example, if a destination node has received L packets, then it may merely indicate that it needs K-L additional packets, which can be represented as a single integer.

A single feedback message is sent by a single destination node at a particular time. Thus, each of the feedback messages 600 are sent by each of the destination nodes 405, respectively. The feedback messages 600 are indexed—for illustration purposes only—by '1', '2' . . . 'n' (in the upper-right corner of a feedback message box) to demonstrate that one or more feedback messages 600 are transmitted by the destination nodes 405, whereby 'n' is equal to the number of destination nodes. In practice, an index may not be included in the actual feedback message.

The feedback message 600 may contain various data fields to indicate information such as, for example, whether additional packets are necessary, how many additional packets are necessary, and identity of the destination node, i.e., the node transmitting the feedback message, a time of transmission, etc. An aggregating node 505, which receives the feedback messages, may utilize the data contained in each feedback message to efficiently aggregate the messages into a single feedback message, as described in further detail below.

As shown in FIG. 6 for illustration purposes only, each feedback message 600 may contain, for example, a node identity field 605, a number of packets needed field 610, and a time stamp field 615. First, the feedback message 600 may include a node identity field 605, which may indicate an identity of the corresponding destination node 405, i.e., the node which transmitted the particular feedback message. The identities of the destination nodes 405 may be especially useful in cases where the number of destination nodes is relatively small. In such cases it may be more efficient for the source node to deliver data messages using unicast communication, rather than multicast which typically uses a network-wide, "best-effort" flood. Thus, to allow this flexibility, when a destination node 405 generates its own request, i.e., feedback message, it may include an identifier for itself within the request.

Second, the feedback message 600 may include a number of packets needed field 610, which may indicate a number of packets needed by the node identified in the node identity field 605. Assuming the total number of packets needed is "K," whereby the original data comprises K packets, then if the destination node has already received a number of packets (L), then the number of remaining packets needed is generally K-L packets. Note that because multicast delivery in LLNs is typically implemented as a "best-effort flood," each device within the same PAN may receive different sets of packets. The dropped packets may or may not be correlated between devices. For example, an interference source may affect only a single device, or alternatively, the interference source may affect an entire portion of the network, e.g., either directly or by blocking all paths to a subset of devices. Thus, the number of packets needed indicated in the number of packets needed field 610 may vary widely on a node-by-node basis.

Third, the feedback message 600 may include a time stamp field 615, which may indicate a time-based component associated with the particular feedback message. The time-based component may be based on, e.g., a global time, an incrementing transmission count, or the like. In particular, by knowing the time at which the feedback message 600 was sent, the aggregating node 505 may be able to detect feedback messages which were previously received and/or aggregated messages which were previously sent by the aggregating node. The time information may also be used by the source to determine how many new packets need to be generated. For example, if the request includes K is packets and time T, and the source has generated X packets since time T, then the source only needs to respond by generating K-X more packets. Accordingly, the aggregating node 505 may adjust an aggregated message to avoid redundant transmissions, as discussed in further detail below.

In addition to examining the data fields contained in the feedback messages 600, the aggregating node 505 may compute the number of destination nodes 405 which are requesting packets from the source. Illustratively, 'n' feedback messages 600 were transmitted by the destination nodes 405 and received by the aggregating node 505. Therefore, because each destination node 405 may transmit only a single feedback message at a time, the aggregating node 505 may determine that 'n' nodes are designated as destination nodes, and thus are to receive data disseminated by the source node.

Figures 7A, 7B:
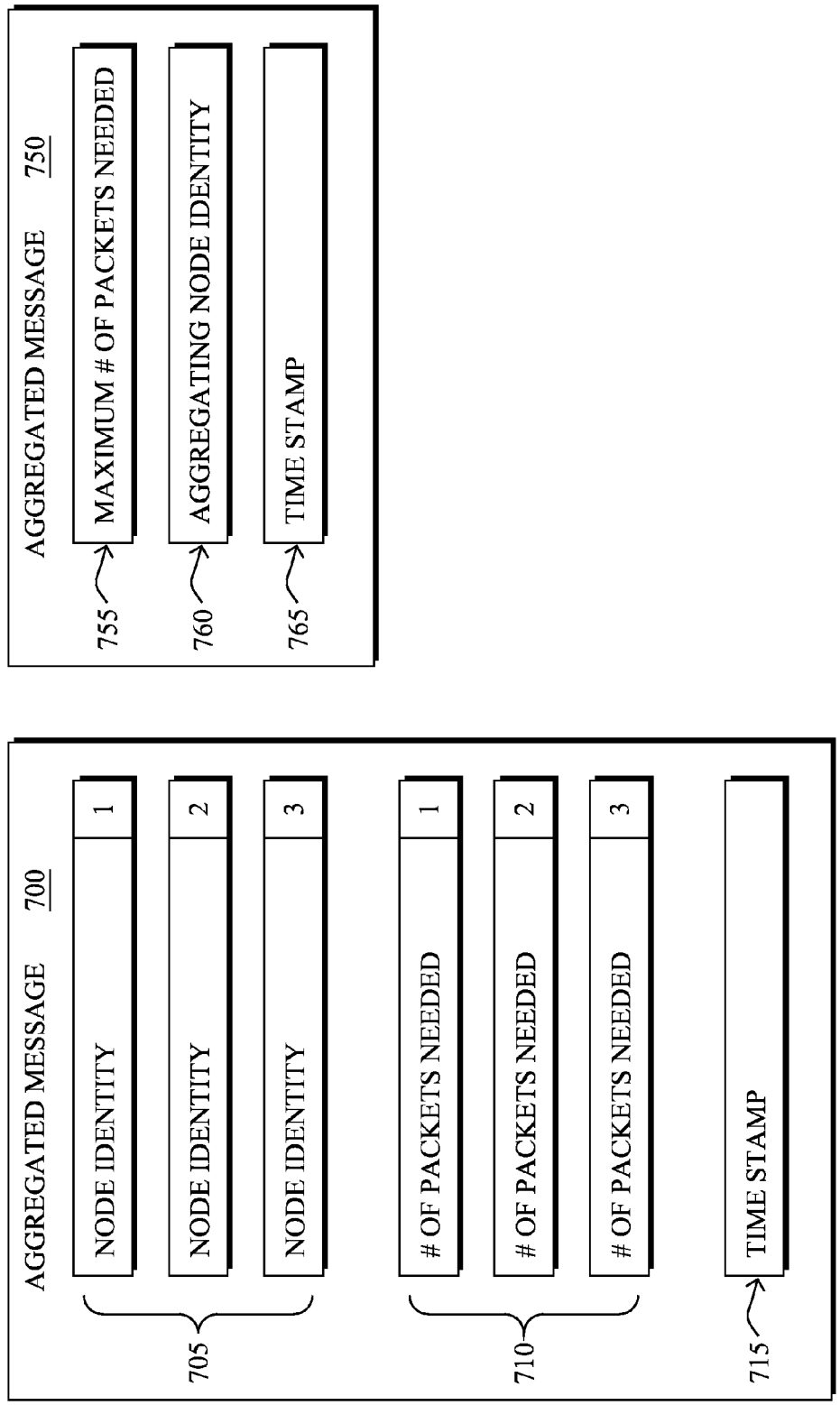
FIGS. 7A and 7B illustrate example aggregated messages.

FIGS. 7A and 7B illustrate example aggregated messages. As shown in FIGS. 7A and 7B, the aggregated messages 700 and 750 contain various data fields, described further below, and are presented as mere examples of possible aggregated messages. It should be understood that the aggregated messages may be configured in any manner suitable to efficiently consolidate one or more feedback messages for subsequent transmission to the source node. Thus, the aggregated messages 700 are depicted in FIG. 7 only for illustration purposes and should not be treated as limiting.

After receiving one or more feedback messages 510 transmitted from the one or more destination nodes 405, the aggregating node 505 aggregates the feedback messages into a single aggregated message. By aggregating feedback messages, a number of advantages may be conferred. For example, i) the number of messages delivered to the source may be reduced, allowing the data disseminations to scale by the number of PANs rather than the number of destination nodes, ii) the option to use unicast is maintained when the number of destination nodes is small, while using multicast when the number of destination nodes is large, iii) redundancy in requesting packets caused by delays in aggregating/propagating the feedback messages may be minimized by including a time indicator in the aggregated message, and iv) the number of feedback message transmissions may be reduced by suppressing transmissions from children nodes.

As illustrated in FIG. 7A, the aggregated message 700 may comprise destination node identity fields 705, corresponding number of packets needed fields 710, and a time stamp field 715. In this regard, the aggregating node 505 may aggregate multiple packet requests, i.e., feedback messages, into a single request, i.e., aggregated message, by listing one or more destination node identifiers and the corresponding number of packets requested. The aggregating node 505 may determine, for example, the identities of the one or more destination nodes 405, and indicate the determined identities in the aggregated message. Moreover, the aggregating node 505 may determine the amount of packets needed by each of the identified destination nodes 405, and indicate the same in the aggregated message.

In accordance with the above, the aggregated message 700 contains three destination node identity fields 705 and three corresponding number of packets needed fields 710. Thus, as shown in FIG. 7A, the destination node identified in the first destination node identity field 705 requested, e.g., needs, the number of packets identified in the first number of packets needed field 710. The destination nodes identifiers may be listed explicitly in the aggregated message, e.g., as shown in FIG. 7A; or, the identifiers may be encoded, e.g., using a probabilistic data structure, such as a Bloom filter.

The aggregating node 505 may indicate the source of each packet request only until a threshold value is reached. As shown in FIG. 7A, the amount of destination nodes 405 which have sent feedback messages to the aggregating node 505 is three. Thus, in order for the identities of the destination nodes to be listed in the aggregated message 700, the amount of destination nodes, e.g., three, may not exceed a predetermined threshold. The aggregating node 505 may determine, from the feedback messages, the amount of destination nodes 405 that sent feedback messages. The threshold value may be used to limit the number of destination nodes 405 identified within an aggregated message, so as to prevent the aggregated message from increasing to an excessive size. The threshold may be based on, e.g., the number of devices, the network topology, etc.

In contrast, as shown in FIG. 7B, the aggregated message 750 may comprise a maximum number of packets needed field 755, an aggregating node identity field 760, and a time stamp field 765. In this regard, when the number of destination node identifiers 705 within an aggregated message is equal to or exceeds the threshold, the aggregating node 505 may remove all such identifiers from the aggregated message. Instead, the aggregating node 505 may determine the amount of packets needed by each destination nodes 405, calculate and store the maximum amount of packets needed by a single destination node, and merely indicate the maximum amount of packets needed in the aggregated message. Alternatively, the maximum amount of packets needed by a single destination node may be indicated in the aggregated message only when a difference between a greatest amount of packets needed by a single destination node and a least amount of packets needed by a single destination node is less than a threshold value. As a result, a maximum amount of packets needed by a single destination node may be indicated in the aggregated message when the difference between packet requests is relatively small; whereas, in a case where the difference between packet requests by the destination nodes is relatively large, it may not be efficient to consolidate the packet requests into a single integer.

Notably, when receiving an aggregated message that identifies one or more destination nodes 405, as in the aggregated message 700, the source node, e.g., FAR 130, may choose to use unicast to deliver a coded packet to the listed destination nodes. However, the source is not required to use unicast and may instead use multicast based on any other information it may have, e.g., network state, routing topology, etc. In addition, if the aggregated message does not identify any destination nodes 405, as in the aggregated message 750, then the source node must use multicast to deliver the coded packets.

An aggregating node 505 may further compare a maximum amount of packets needed by a single destination node to a previous maximum amount of packets needed by a single destination node that was previously stored. The aggregating node may thus reduce redundant transmissions by indicating the current maximum amount of packets needed only when the current maximum amount of packets needed by a single destination node exceeds the previous maximum amount of packets needed by a single is destination node. For example, it may be unnecessary to send an aggregated message requesting five packets, when the node previously transmitted a request for ten packets. This is due to properties of rateless codes, which allow for a destination node to request any K-L packets to recover an original data, rather than having to request specific packets. When an aggregating node 505 receives a feedback message requesting an amount of packets that is less than an amount previously request, the aggregating node may simply drop the message, for example. As a result, this aggregation mechanism allows the feedback to scale based on the number of FARs, rather than the number of receivers, thus increasing overall efficiency.

Even further, when the amount of destination nodes is equal to or exceeds the threshold value, the aggregating node may indicate its own identity in the aggregated message, effectively identifying itself as the sub-DAG root, i.e., the common ancestor of nodes which have requested more packets. If the aggregated message identifies a sub-DAG root, the source node may tunnel the packets to the sub-DAG root identified in the message. Once the packet reaches the sub-DAG root, the sub-DAG root may then initiate a dissemination of the packet down its sub-tree. Doing so may effectively reduce the dissemination scope.

As shown in FIGS. 7A and 7B, the aggregated messages 700 and 750 may also comprise a time stamp 715 and 765, respectively. Aggregating and propagating request messages from the destination nodes 405 to the source node can incur significant delays. During this time, the source may have already generated additional messages, e.g., disseminated additional packets, since the request message was generated. Thus, the aggregating node 505 may indicate a time-based component, e.g., time stamp 715 and 765, in the aggregated message based on a time of transmission. The time-based component may be based on any suitable time indicator means, such as, for example, a global time or an incrementing transmission count.

The source may use the time stamp to account for messages already sent since the aggregated message was generated. In addition, the forwarding devices, i.e., aggregating nodes, can also use the time-based component to account for messages that were received—thus determining how many messages were sent—since the request message was generated. Specifically, the aggregating node 505 may determine a time-based component associated with each feedback message, determine a time-based relationship between each feedback message and feedback messages that were previously received, and adjusting the aggregated message so as to reduce the number of requested packets. In addition, or as an alternative, the source may generate fewer packets based on how many packets were generated since the time noted in the timestamp.

Figure 8:
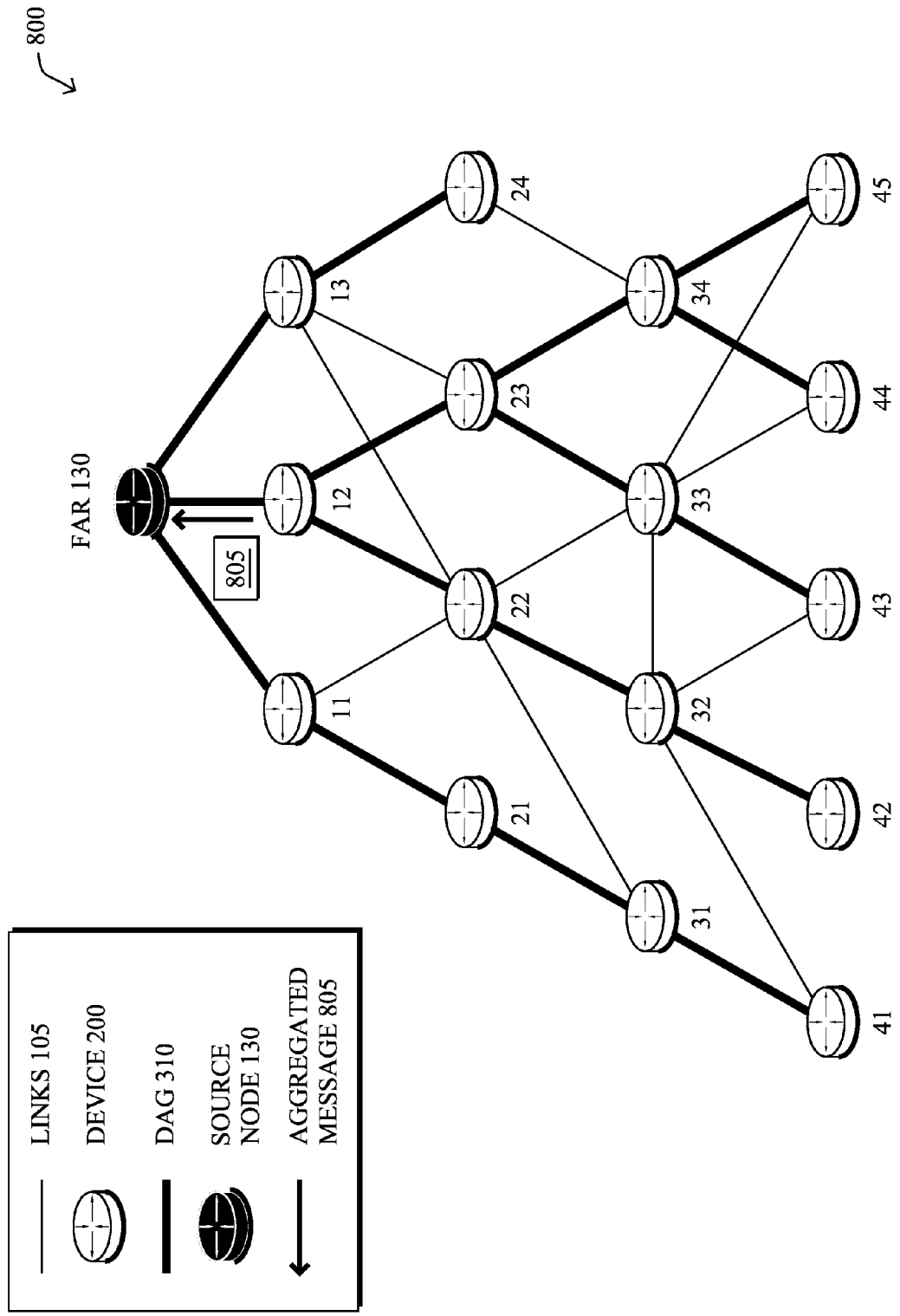
FIG. 8 illustrates an example of aggregated feedback message transmission from the sub-DAG node to the source node.

FIG. 8 illustrates an example of aggregated feedback message transmission from the sub-DAG node to the source node. As shown in FIG. 8, the network 800 comprises nodes 200 interconnected via communications links 105, whereby selected links form the DAG 310 (shown as bolded lines), which extends from the root node 130 toward one or more leaf nodes. The network 800 is arranged in the same manner as shown in FIG. 3.

After aggregating one or more feedback messages 510 into a single aggregated message 805, as shown in FIG. 7, the aggregating node, i.e., node "12", as shown in FIG. 5, transmits the aggregated message toward the source node, i.e., FAR 130. In one embodiment, the aggregating node may transmit the aggregated message 805 as a 1-hop distributed message, using a 1-hop broadcast/multicast/promiscuous mode. As a result, other neighboring devices may receive the forwarded request message, beyond the intended next-hop forwarding devices, thereby enabling additional opportunities for suppression. For example, a forwarding node can suppress transmissions from its "children" nodes, rather than having to receive a feedback message from each child. In other words, a device need not send a request to the next-hop if the next-hop has already sent a request on behalf of other devices.

As should be understood, the network 800 may be one of several PANs, each with a respective FAR "root" node. As such, it is possible for devices within a particular PAN, such as the network 800, to migrate to a different nearby PAN. Thus, rather than sending the same coded packet to all PANs, a randomly coded packet may be generated for each PAN. Different PANs will likely require different numbers of coded data packets to satisfy all receivers, i.e., destination nodes, within the PAN. By generating is randomly coded packets for each PAN, each packet received by a destination node may contain new, useful data, even when migrating between PANs. In contrast, by using the same sequence of coded packets across all PANs, a device may receive redundant packets when migrating to a different PAN.

Figure 9:
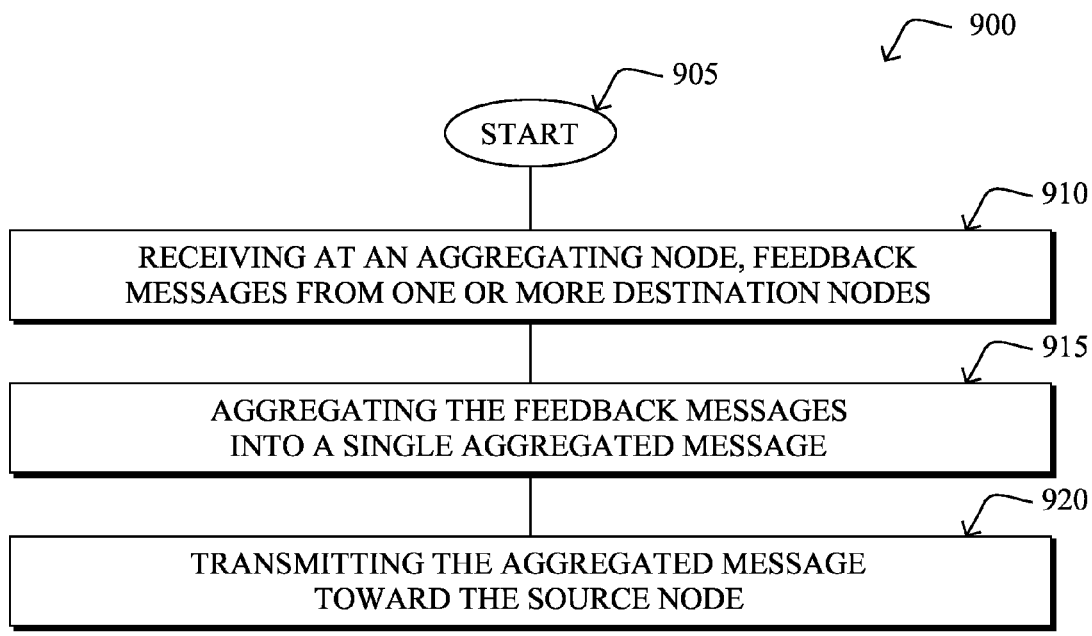
FIGS. 9 and 10 illustrate example simplified procedures for reliable feedback aggregation for bulk data dissemination.
Figure 10:
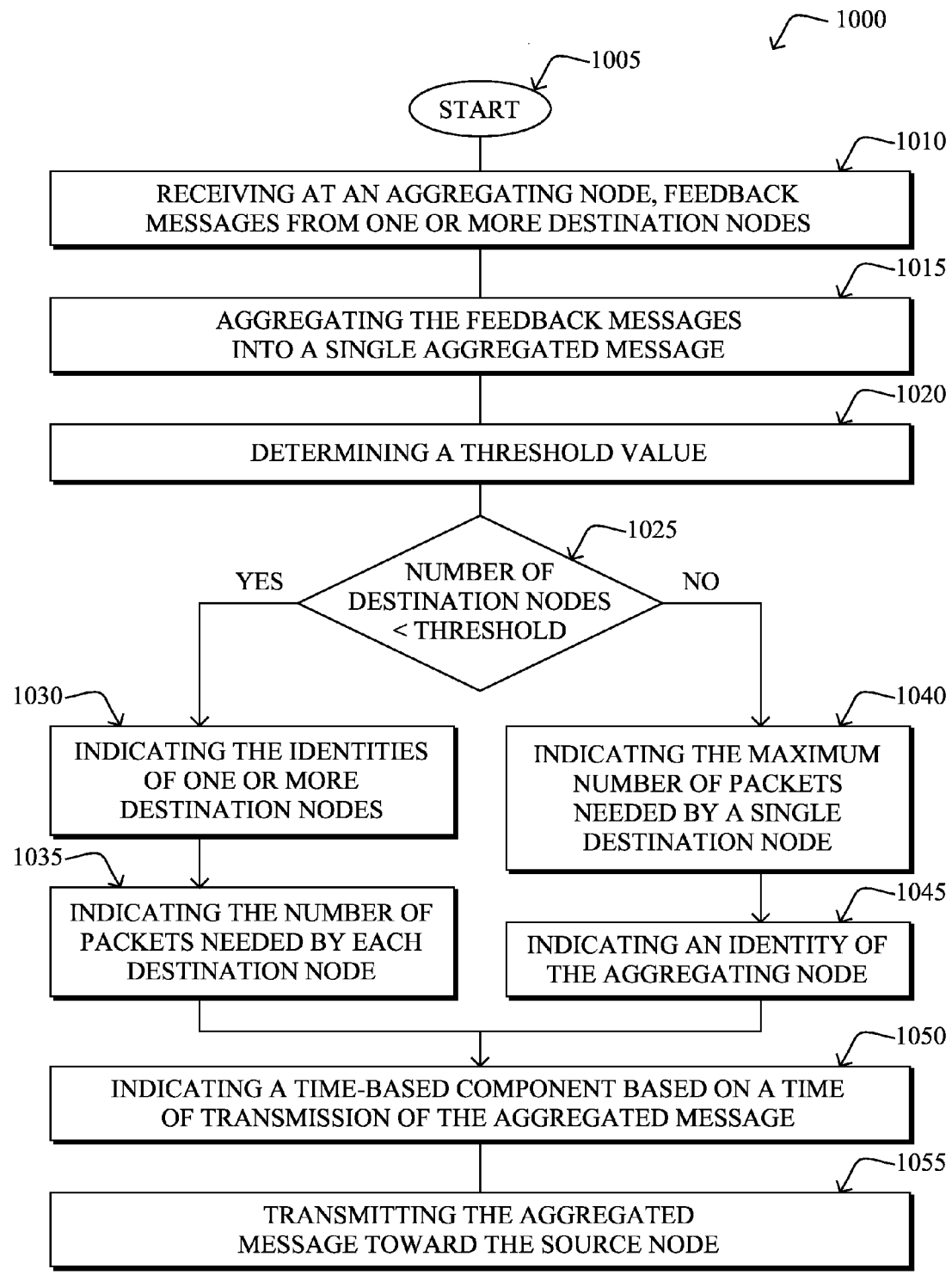

FIGS. 9 and 10 illustrate example simplified procedures for feedback aggregation for reliable bulk data dissemination. As shown in FIG. 9, the procedure 900 may start at step 905, continue to step 910, and so forth, where, as described in greater detail above, feedback messages for reliable bulk data dissemination using rateless codes are aggregated. Although FIG. 9 depicts steps in a particular order, it should be understood that the depicted embodiment is not limiting, and the particular order, as well as the selected steps, are depicted merely for illustration purposes.

At Step 910, the procedure 900 includes receiving, at an aggregating node, feedback messages from one or more destination nodes. The destination nodes are designated to receive data as packets from a source node using rateless coding. The feedback messages are transmitted toward the source node, e.g., a FAR. Along the way, the feedback messages from the destination nodes may be received by an aggregating node, or a "sub-DAG node." For the purposes of receiving, and later aggregating, one or more feedback messages, the aggregating node may be viewed as a source node of a sub-portion of the DAG.

At Step 915, the procedure 900 further includes aggregating the feedback messages into a single aggregated message. The aggregated message may include a variety of information, such as, for example, the identities of the destination nodes, the corresponding number of packets needed, the maximum number of packets needed by a single node, an identity of the aggregating node, and a time stamp. The information contained in the aggregated message may depend on whether a threshold value is reached. The threshold value may be based on, e.g., the number of devices, the network topology, etc. Aggregating the potentially large amount of feedback messages at the aggregating node confers several benefits to the overall network performance. For instance, the number of messages delivered to the source node may be reduced, allowing is the data disseminations to scale by the number of PANs rather than the number of destination nodes.

At Step 920, the procedure 900 further includes transmitting the aggregated message toward the source node. After aggregating one or more feedback messages into a single aggregated message, as shown in FIG. 7, the aggregating node may transmit the aggregated message toward the source node, i.e., a FAR. The aggregating node may transmit the aggregated message as a 1-hop distributed message, using a 1-hop broadcast/multicast/promiscuous mode. As a result, other devices may receive the forwarded request message, beyond the intended next-hop forwarding devices, thereby enabling additional opportunities for suppression.

As shown in FIG. 10, the procedure 1000 may start at step 1005, continue to step 1010, and so forth, where, as described in greater detail above, feedback messages for reliable bulk data dissemination using rateless codes are aggregated. Although FIG. 10 depicts steps in a particular order, it should be understood that the depicted embodiment is not limiting, and the particular order, as well as the selected steps, are depicted merely for illustration purposes.

At Step 1010, the procedure 1000 includes receiving, at an aggregating node, feedback messages from one or more destination nodes. The destination nodes are designated to receive data as packets from a source node using rateless coding. At Step 1015, the procedure 1000 further includes aggregating the feedback messages into a single aggregated message. Steps 1010 and 1015 correspond to Steps 910 and 915 respectively, and are described in further detail above.

At Step 1020, the procedure 1000 further includes determining a threshold value. As described above, an aggregating device may explicitly indicate the identities of each destination node, as well the corresponding packets needed by each node, while only omitting the destination node identities after reaching a threshold. The threshold value may be based on, e.g., the number of devices, the network topology, etc.

At Step 1025, the procedure 1000 further includes determining whether the number of destination nodes is less than the threshold. If the number of destination nodes is less than the threshold, the procedure 1000 continues to Step 1030, where the aggregating node indicates, in the aggregated message, the identities of the one or more destination nodes. At Step 1035, the aggregating node further indicates, in the aggregated message, the amount of packets needed by each of the corresponding destination nodes.

If the number of destination nodes is not less than the threshold, the procedure 1000 instead continues to Step 1040, where the aggregating node indicates, in the aggregated message, the maximum amount of packets needed by a single destination node. At Step 1045, the aggregating node further indicates, in the aggregated message, an identity of the aggregating node, i.e., its own identity.

At Step 1050, the procedure 1000 further includes indicating, in the aggregated message, a time-based component based on a time of transmission of the aggregated message. Aggregating and propagating request messages from the destination nodes to the source node can incur significant delays. During this time, the source node may have already generated additional messages, e.g., disseminated additional packets, since the request message was generated. Thus, the aggregating node may indicate a time-based component, e.g., time stamp, in the aggregated message based on a time of transmission. The time-based component may be based on any suitable time indicator means, such as, for example, a global time or an incrementing transmission count.

At Step 1055, the procedure 1000 further includes transmitting the aggregated message toward the source node. After aggregating one or more feedback messages into a single aggregated message, as shown in FIG. 7, the aggregating node may transmit the aggregated message toward the source node, i.e., a FAR.

It should be understood that the steps shown in FIGS. 9 and 10 are merely examples for illustration, and certain steps may be included or excluded as desired. Further, while a particular order of the steps is shown, this ordering is merely illustrative, and any suitable arrangement of the steps may be utilized without departing from the scope of the embodiments herein. Moreover, while the procedures 900 and 1000 are described separately, certain steps from each procedure may be incorporated into each other procedure, and the procedures are not meant to be mutually exclusive.

The techniques described herein, therefore, provide for feedback aggregation for reliable bulk data dissemination using rateless codes, particularly in LLNs. By aggregating request messages, the disclosed embodiments are configured to: i) reduce the number of messages delivered to the source node, allowing the feedback transmissions to scale by the number of PANs rather than the number of receivers, ii) maintain the option for the source node to use unicast when the number of requesting receivers is small, but allow multicast when the number of receivers is large, iii) include a time-indicating component to minimize redundancy in requesting packets caused by delays in aggregating and/or propagating the feedback messages, and iv) reduce the number of request message transmissions by suppressing transmissions from children nodes. Furthermore, the disclosed embodiments enable efficient data dissemination, even in when a node migrates to a different PAN, by randomly generating different coded packets for each PAN.

While there have been shown and described illustrative embodiments that provide for feedback aggregation for reliable bulk data dissemination using rateless codes, it is to be understood that various other adaptations and modifications may be made within the spirit and scope of the embodiments herein. For example, the embodiments have been shown and described herein primarily with relation to LLN networks. However, the embodiments in their broader sense are not as limited, and may, in fact, be used with other types of networks and/or protocols.

Moreover, the foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as an apparatus that comprises at least one network interface that communicates with a network, e.g., an LLN, a processor coupled to the at least one network interface, and a memory configured to store program instructions executable by the processor. Further, it is expressly contemplated that the components and/or elements described herein can be implemented as software being stored on a tangible, non-transitory computer-readable medium (e.g., disks/CDs/RAM/EEPROM/etc.) having program instructions executable by a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method, comprising:
receiving, at an aggregating node in a network, feedback messages from one or more destination nodes in the network, the destination nodes being designated to receive data as packets from a source node using rateless coding, wherein the feedback messages indicate whether packets are needed at a corresponding destination node to complete the data;
determining, from the feedback messages, an amount of packets needed by each of the corresponding destination node;
calculating and storing a maximum amount of packets needed by a single destination node;
aggregating the feedback messages into a single aggregated message, wherein the aggregated message is a single integer that represents the maximum amount of packets needed at any one of the one or more destination nodes, wherein the maximum amount of packets is indicated in the aggregated message only when a difference between a greatest amount of packets needed by a single destination node and a least amount of packets needed by a single destination node is less than a threshold value; and
transmitting the aggregated message toward the source node.

2. The method according to claim 1, further comprising:
detecting a previous maximum amount of packets needed by a single destination node that was previously stored, wherein
the maximum amount of packets is indicated in the aggregated message only when the maximum amount of packets exceeds the previous maximum amount of packets.

3. The method according to claim 1, further comprising:
determining, from the feedback messages, identities of the one or more destination nodes; and
indicating, in the aggregated message, the identities of the one or more destination nodes.

4. The method according to claim 3, further comprising:
determining, from the feedback messages, an amount of destination nodes of the one or more destination nodes, wherein
the identities of the one or more destination nodes are indicated in the aggregated message only when the amount of destination nodes is less than a threshold value.

5. The method according to claim 4, further comprising:
indicating, in the aggregated message, the amount of packets needed by each of the one or more destination nodes only when the amount of destination nodes is less than the threshold value.

6. The method according to claim 4, further comprising:
indicating, in the aggregated message, an identity of the aggregating node when the amount of destination nodes is not less than the threshold value.

7. The method according to claim 1, further comprising:
indicating, in the aggregated message, a time-based component based on a time of transmission of the aggregated message.

8. The method according to claim 1, further comprising:
determining, from the feedback messages, a time-based component associated with each feedback message;

determining, based on the time-based component, a timing relationship between the feedback messages and feedback messages that were previously received; and reducing an amount of packets requested in the aggregated message.

9. The method according to claim 1, further comprising: transmitting the aggregated message as a 1-hop distributed message.

10. The method according to claim 1, wherein:
the one or more destination nodes can migrate between networks, and
the one or more destination nodes receive a randomly coded packet in each network.

11. An apparatus, comprising:
one or more network interfaces that communicate with a network;
a processor coupled to the one or more network interfaces and configured to execute a process; and
a memory configured to store program instructions which contain the process executable by the processor, the process comprising:
receiving, at an aggregating node in the network, feedback messages from one or more destination nodes in the network, the destination nodes being designated to receive data as packets from a source node using rateless coding, wherein the feedback messages indicate whether packets are needed at a corresponding destination node to complete the data;
determining, from the feedback messages, an amount of packets needed by each of the corresponding destination nodes;
calculating and storing a maximum amount of packets needed by a single destination node;
aggregating the feedback messages into a single aggregated message, wherein the aggregated message is a single integer that represent the maximum amount of packets needed at any one of the one or more destination nodes, wherein the maximum amount of packets is indicated in the aggregated message only when a difference between a greatest amount of packets needed by a single destination node and at least amount of packets needed by a single destination node is less than a threshold value; and
transmitting the aggregated message toward the source node.

12. The apparatus according to claim 11, wherein the process further comprises:
detecting a previous maximum amount of packets needed by a single destination node that was previously stored, wherein
the maximum amount of packets is indicated in the aggregated message only when the maximum amount of packets exceeds the previous maximum amount of packets.

13. The apparatus according to claim 11, wherein the process further comprises:
determining, from the feedback messages, identities of the one or more destination nodes; and
indicating, in the aggregated message, the identities of the one or more destination nodes.

14. The apparatus according to claim 13, wherein the process further comprises:
determining, from the feedback messages, an amount of destination nodes of the one or more destination nodes, wherein the identities of the one or more destination nodes are indicated in the aggregated message only when the amount of destination nodes is less than a threshold value.

15. The apparatus according to claim 14, wherein the process further comprises:
indicating, in the aggregated message, the amount of packets needed by each of the one or more destination nodes only when the amount of destination nodes is less than the threshold value.

16. The apparatus according to claim 14, wherein the process further comprises:
indicating, in the aggregated message, an identity of the aggregating node when the amount of destination nodes is not less than the threshold value.

17. The apparatus according to claim 11, wherein the process further comprises:
indicating, in the aggregated message, a time-based component based on a time of transmission of the aggregated message.

18. The apparatus according to claim 11, wherein the process further comprises:
determining, from the feedback messages, a time-based component associated with each feedback message;
determining, based on the time-based component, a timing relationship between the feedback messages and feedback messages that were previously received; and
reducing an amount of packets requested in the aggregated message.

19. The apparatus according to claim 11, wherein the process further comprises:
transmitting the aggregated message as a 1-hop distributed message.

20. The apparatus according to claim 11, wherein:
the one or more destination nodes can migrate between networks, and
the one or more destination nodes receive a randomly coded packet in each network.

21. A tangible non-transitory computer readable medium storing program instructions that cause a computer to execute a process, the process comprising:
receiving, at an aggregating node in a network, feedback messages from one or more destination nodes in the network, the destination nodes being designated to receive data as packets from a source node using rateless coding, wherein the feedback messages indicate whether packets are needed at a corresponding destination node to complete the data;
determining, from the feedback messages, an amount of packets needed by each of the corresponding destination nodes;
calculating and storing a maximum of packets needed by a single destination node;
aggregating the feedback messages into a single aggregated message, wherein the aggregated message is a single integer that represents the maximum amount of packets needed at any one of the one or more destination nodes, wherein the maximum amount of packets is indicated in the aggregated message only when a difference between a greatest amount of packets needed by a single destination mode and a least amount of packets needed by a single destination node is less than a threshold value; and
transmitting the aggregated message toward the source node.

* * * * *